United States Patent [19]
Teng

[11] Patent Number: 5,688,555
[45] Date of Patent: Nov. 18, 1997

[54] GAS BARRIER DURING EDGE RINSE OF SOG COATING PROCESS TO PREVENT SOG HUMP FORMATION

[75] Inventor: Ming-Chang Teng, Hsin-Chu, Taiwan

[73] Assignee: Taiwan Semiconductor Manufacturing Company Ltd, Hsin-Chu, Taiwan

[21] Appl. No.: 657,223

[22] Filed: Jun. 3, 1996

[51] Int. Cl.⁶ ........................................ B05D 3/12
[52] U.S. Cl. ................ 427/240; 427/336; 427/348; 427/385.5; 118/52; 118/56; 118/320; 437/231
[58] Field of Search .................. 427/240, 273, 427/336, 348, 385.5; 437/231; 118/52, 56, 326

[56] References Cited

U.S. PATENT DOCUMENTS

| | | | |
|---|---|---|---|
| 4,668,334 | 5/1987 | Doornveld | 427/240 |
| 4,822,639 | 4/1989 | Fujii et al. | 427/240 |
| 5,001,084 | 3/1991 | Kawai et al. | 437/231 |
| 5,238,713 | 8/1993 | Sago et al. | 427/240 |
| 5,254,367 | 10/1993 | Matsumura et al. | 427/240 |

OTHER PUBLICATIONS

"Theory and Problems of Hydraulics and Fluid Mechanics", by R.V. Giles, Schaum Publishing Co. pp. 142–143 (no mo.).

*Primary Examiner*—Janyce Bell
*Attorney, Agent, or Firm*—George O. Saile; Stephen B. Ackerman

[57] ABSTRACT

A method and an apparatus are disclosed for preventing the formation of humps along the edge of substrates while being spin coated. Said humps are especially observed in edge rinsing substrates that are being coated with spin-on-glass (SOG) and state of the art photoresists. The edge rinse is usually directed at the edge of the substrate at a certain angle from the vertical axis of the rotating substrate. The hump is a consequence of the phenomenon of hydraulic jump that occurs in fluid flow. The humps, later in the manufacturing process, disintegrate causing particle contamination problems. A novel technique is proposed where the formation of humps is prevented by directing a jet stream of gas at the hump. The jet is placed along the plane of the spinning substrate, and behind the rinse nozzle in the direction of the spin.

25 Claims, 4 Drawing Sheets

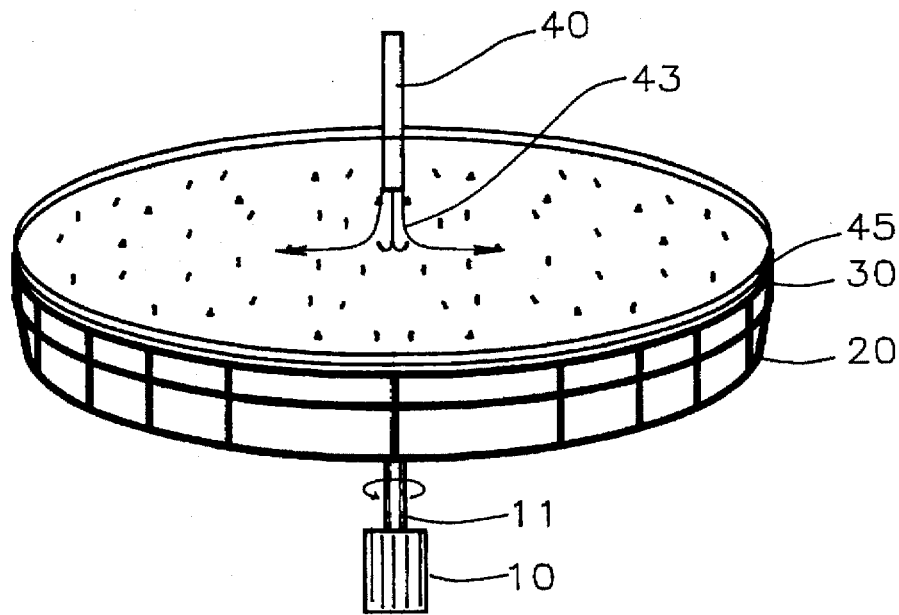
*FIG. 1a – Prior Art*
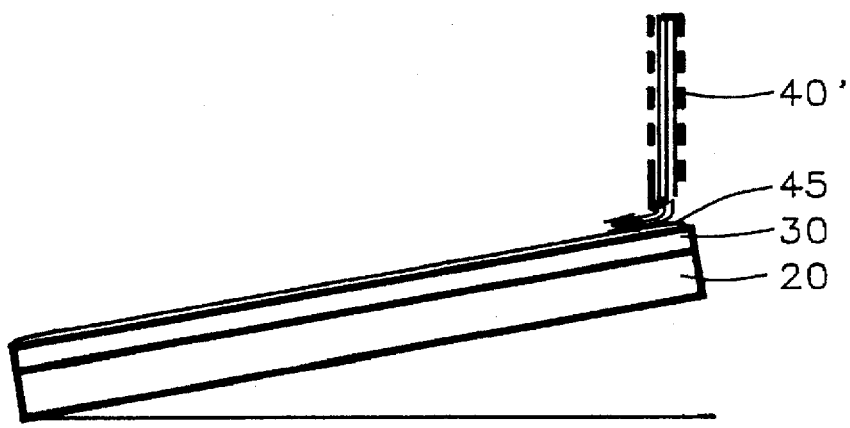
*FIG. 1b – Prior Art*

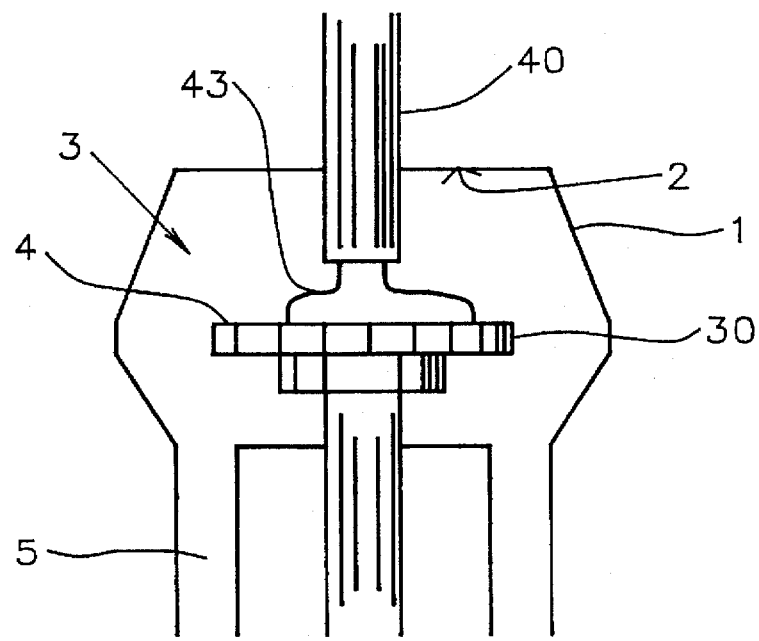
FIG. 2a – Prior Art
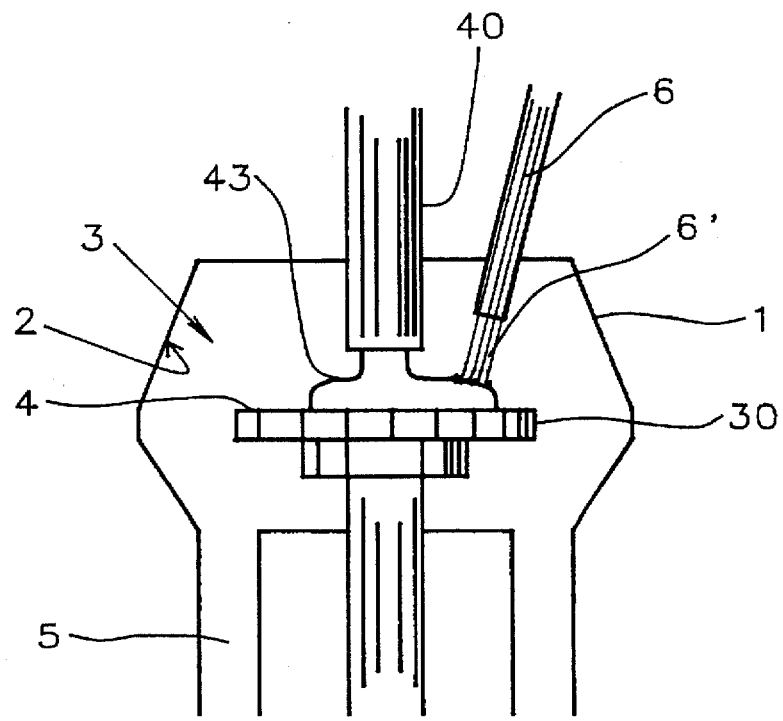
FIG. 2b – Prior Art

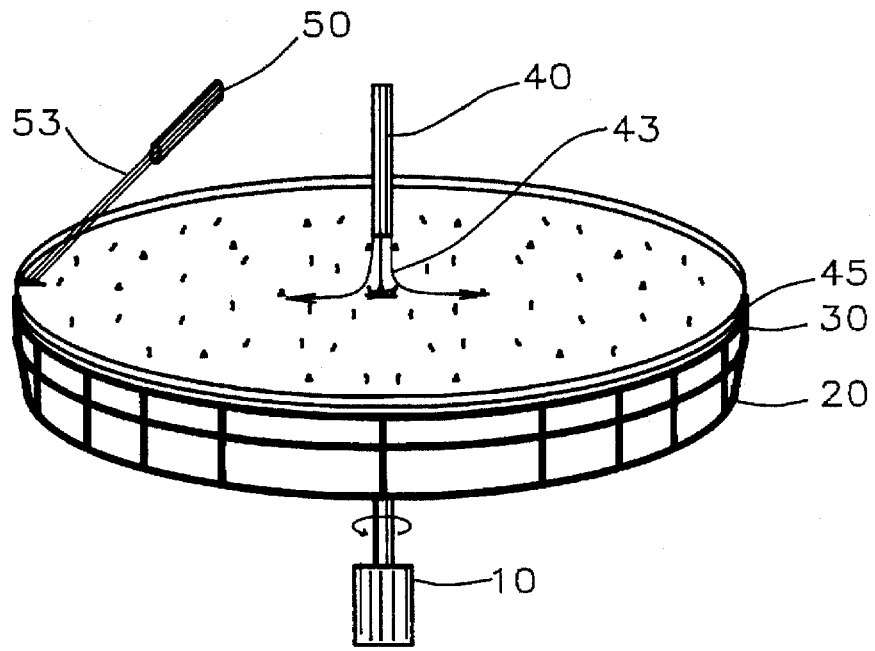
*FIG. 3a - Prior Art*
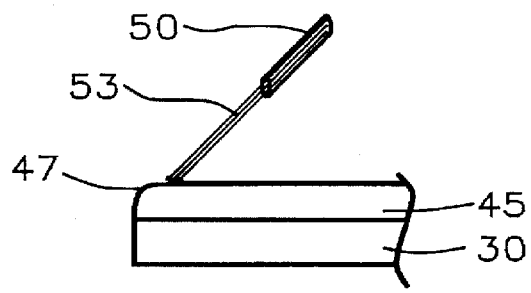
*FIG. 3b - Prior Art*
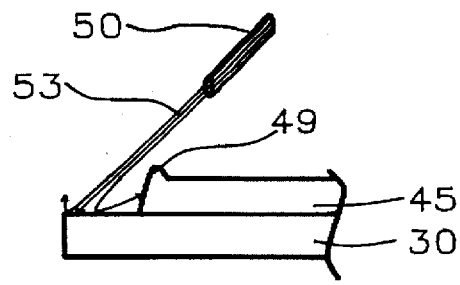
*FIG. 3c - Prior Art*

GAS BARRIER DURING EDGE RINSE OF SOG COATING PROCESS TO PREVENT SOG HUMP FORMATION

BACKGROUND OF THE INVENTION (1) Field of the Invention

The invention relates generally to a method of spin coating materials and in particular to a method of applying a spin-on-material and to an apparatus thereof, in the manufacture of semiconductor devices.

(2) Description of the Related Art

Spin coating of materials is practiced in many facets of the industry ranging from painting articles to the manufacture of wafers in a semiconductor factory. Spin coating provides a means for expeditiously covering an object with a coating material—which is usually in liquid form—by dispensing a certain amount of the material on the object and spinning the object, such as on a turntable, thereby taking advantage of centrifugal forces to affect the distribution of said coating material over the object. The object article may be spun either during or after the spin-on-material, hereafter referred to as SOM, is placed on it. The method of placement of said SOM, and the manner and speed with which the article is spun on are dictated by many factors including mainly the properties of the material that is being spun and the desired characteristics of the end product.

In the field of manufacture of semiconductor devices, spin coating method is employed at several different process steps. In one process, a coating solution of photosensitive material such a photo-resist or a gelatinous silver halide emulsion is applied by said method to a substrate in the form of a silicon wafer, or photo mask blank made up of a glass plate with a metal film. In another process, spin-on glass (SOG) in liquid form is spun on to form interlevel dielectric layers in between metal layers on a wafer. In each one of these process steps, special consideration must be given in accordance with the properties of the materials that are being spun to assure that the resulting film has the proper thickness, proper uniformity of thickness, and that it is defect free. For example, solvents in SOG evaporate very quickly after being dispensed, and therefore an optimum dispense/spin cycle must be developed so that the adequate thickness film uniformity is achieved.

Over the years, several methods and apparatus have been developed for spin coating materials on wafers to solve certain set of problems. These range from the problems of coverage of coating on wafer, to non-uniformity of thickness of coating, location of dispense nozzle and/or the number of nozzles over the wafer, the cleanliness of the nozzle, the cleanliness of the chamber in which spinning is accomplished and the effectiveness of the exhaust system of the chamber in producing non-defective parts. None of the prior art, however, seems to address the problem of particulate generation from the spun on film (SOF) itself and its detrimental effects. The present invention discloses the origins of a phenomenon which not only causes non-uniformity of SOF but also forms another source for particulate contamination in spin coating process and also proposes solutions therefor.

U.S. Pat. No. 4,822,639 addresses the problem of non-uniformity of SOF caused by a horizontally spinning turntable that is conventionally used. Thus in FIG. 1a, a motor (10) turns turntable (20) in a horizontal position. A spin-on-material, SOM (43), such as (SOG), is dispensed from nozzle (40) positioned centrally—as is common in prior art—over said turntable. After substrate (30) is placed on said turntable (20), a predetermined amount of said SOM (43) is dispensed on said substrate through said nozzle (40). Thereafter, while the substrate is being held by conventional means, including vacuum suction in a vacuum chuck, turntable (20) is rotated at slow speed of between about 100 revolutions per minute (rpm) to 1000 rpm until SOM (43) spreads over the entire surface of substrate (30) to form a layer of (SOF) 45. Subsequent to this operation, turn table (20) is rotated at high speed between about 2000 rpm to 6000 rpm so that SOF is formed on substrate (20) to the desired thickness. It is disclosed in U.S. Pat. No. 4,822,639 that depending upon the physical properties, such as wettability, viscosity of SOM, and the size of the substrate used, the uniformity of the resulting SOF thickness varies substantially over the substrate. It is proposed in the same Patent that, especially in the case with silver halide emulsion which does not sufficiently wet the substrate, the substrate be tilted a certain number of degrees, $\Phi$, from the horizontal initially so that the SOM flows down the substrate to cover the entire surface of the latter prior to rotating the turntable, FIG. 1b. Subsequently, the substrate is held horizontal, and rotated so that a layer of SOF of uniform thickness is formed on the substrate. In this proposal, said SOM dispensing nozzle is placed close to one edge of the substrate as shown in phantom (40') in FIG. 1b. It is disclosed later in the present invention that because of the nature of films that are formed with certain spin on materials, further methods are needed to eliminate other non-uniformity problems.

Another common problem that is associated with spin coating in the manufacture of semiconductors is the defects caused by the mist that is formed on the insides of the coating chamber (1) of FIG. 2a by the spin-on-material (SOM). This is because, as SOM (43) is being dispensed on rotating substrate (30), some of it is scattered by centrifugal force beyond the substrate onto the inside walls (2) of the spinning chamber (1) in FIG. 2a. When large number of substrates are coated with SOM, the inner walls (2) of the sealed chamber (1) become saturated with drops of SOM (43), and a substantial amount of mist of the spun on material is formed in regions (3). As disclosed in U.S. Pat. No. 5,001,084, a portion of the mist adheres to the top surface (4) of substrate (30), producing defects in the pattern on substrate (30). A method is disclosed in the same patent for preventing the formation of such defects by providing one or more cleaning nozzles (6) inside chamber (1) as shown in FIG. 2b. In this method, cleaning fluid (6') is first discharged from nozzle (6) onto substrate (30) prior to the spin coating of SOM (43) on said substrate. The cleaning fluid is thrown outwards from the surface of the substrate by centrifugal force and strikes the inner surface (2) of the sealed chamber (1). Said cleaning fluid then flows downwards along inner walls (2) into chamber exhaust (5) and, in doing so, removes any SOM (43) remaining on said walls from the previous coating process of the previous substrates. In this manner, inner walls are kept clean, as a result of which mist (3) is not formed to cause defects on substrate (30).

In addition to the problems of non-uniformity of SOF thickness, and defects caused by SOM, that are described in prior art, it has been observed in the present state of the manufacturing line that similar problems arise from a different source; namely, when spin on film or SOF is formed on a substrate, the edge of the forming film advances in such a manner so as to cause a hydraulic jump. This is found to be especially true when edge cleaning or rinsing jets (53) of prior art are used as shown in FIG. 3a. Hydraulic jump is a phenomenon that occurs in fluid flow, which may be explained briefly as described in "Theory and Problems of Hydraulics and Fluid Mechanics" by R. V. Giles, Schaum Publishing Company, pp. 142–143: for a constant unit flow of fluid in a rectangular channel, there is a critical depth at which the fluid will flow when its specific energy is minimum corresponding to a critical velocity. For uniform flow, the specific energy remains constant from section to section in the channel, while for non-uniform flow as over a substrate, the specific energy along the channel any increase or decrease. Flows occurring at depths below and above the critical depth are classified as supercritical and subcritical, respectively. When a supercritical flow changes to a subcritical flow, hydraulic jump occurs. As a result, the thickness of the flowing coating material is not uniform all the way out to edge (47) as shown in FIG. 3b. Furthermore, a hydraulic jump or a relatively high hump (49) of FIG. 3c is developed which disintegrates later on under thermal cycling to form unwanted particulate contaminants, which in turn cause defective product. It has been found that this phenomenon occurs especially in the spin coating of SOG in the manufacture of semiconductor devices.

What is needed, therefore, is a method and an apparatus for preventing the occurrence of said high humps.

SUMMARY OF THE INVENTION

It is therefore an object of this invention to provide a method for substantially leveling and also eliminating humps formed in spin coating of materials in general, and of SOG in particular, in the manufacture of semiconductor devices.

It is another object of this invention to provide a method for reducing defects caused by said humps formed in spin coating of materials in general, and of SOG in particular.

It is a further object of the present invention to provide an apparatus for eliminating humps formed in spin coating of materials.

These objects are achieved by providing an apparatus having a jet stream directed at the edge of spun-on-film (SOF) on a substrate. Said jet stream consists of a suitable gas such as dry nitrogen or argon, and is positioned following the edge cleaning or rinse nozzle. The objects are further achieved by providing a method wherein the jet stream is directed immediately at the hydraulic jump formed therein by the solution emanating from the edge rinse nozzle. In this manner, the jet stream prevents the formation of humps at the edge of the spinning substrate. In the absence of such humps, therefore, there is no excess material to crack and disintegrate later on under thermal cycling. Consequently, no particulate contaminants are formed to cause defects in the manufactured product.

BRIEF DESCRIPTION OF THE DRAWINGS

FIG. 1a is a perspective view of a prior art spin coating apparatus.

FIG. 1b is a side view of prior art spin coating apparatus shown in FIG. 1b shown in a tilted position.

FIG. 2a is a schematic drawing of another prior art spin coating apparatus shown in its sealed chamber.

FIG. 2b the same prior art apparatus shown in FIG. 2a having also a cleaning nozzle.

FIG. 3a is a perspective drawing of still another prior art spin coating apparatus having an edge rinse nozzle.

FIG. 3b is an enlarged cross section of the edge of the substrate and the condition of the spun-on-film of FIG. 3a showing the initial action of the edge rinse nozzle on said edge.

FIG. 3c is an enlarged cross section of the edge of the substrate and the condition of the spun-on-film of FIG. 3a showing the formation of a hump as a result of prior art methods.

The drawings are not necessarily drawn to scale, but instead are drawn so as to illustrate the important features of the invention.

DESCRIPTION OF THE PREFERRED EMBODIMENTS

Figure 4A:
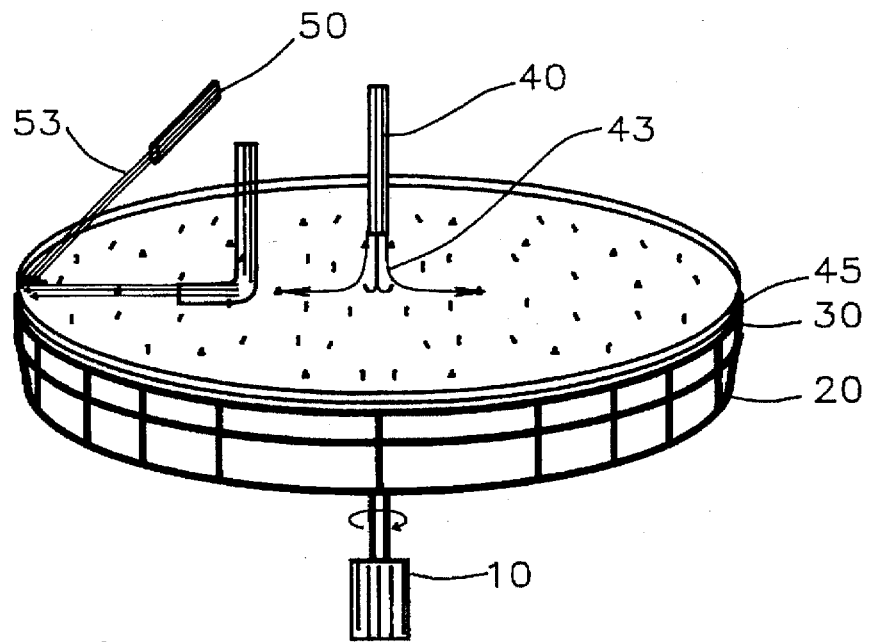
FIG. 4a is a perspective drawing of spin coating apparatus having a jet stream according to the present invention.

Referring now to the drawings, more particularly to FIG. 4a, there is shown a spin coating apparatus according to this invention. The apparatus comprises a turntable (20), a dispense nozzle (40), edge rinse nozzle (50) and a jet nozzle (60). Substrate (30) to be coated is placed under said nozzles in an arrangement specified below, and held down to turntable (20) preferably by means of vacuum suction. As is the case for the conventional apparatus of FIGS. 2a and 2b, the apparatus in FIG. 4a is housed in a sealed chamber, which itself is not significant to the invention, and therefore not described here in order not to unnecessarily obscure the present invention. As in prior art, turntable (20) is connected by means of shaft (11) to motor (10) which is usually placed outside said chamber.

Figure 4B:
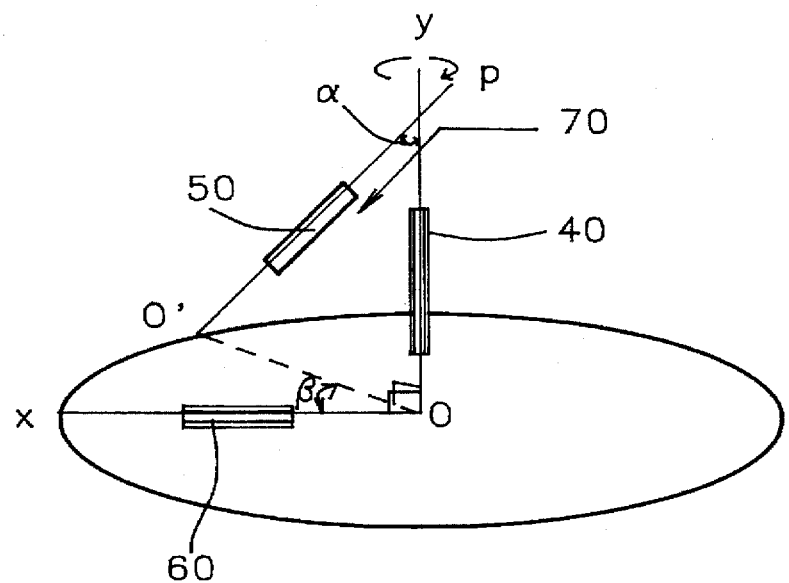
FIG. 4b is a schematic drawing of the spatial relationship of nozzles of this invention.
Figure 4C:
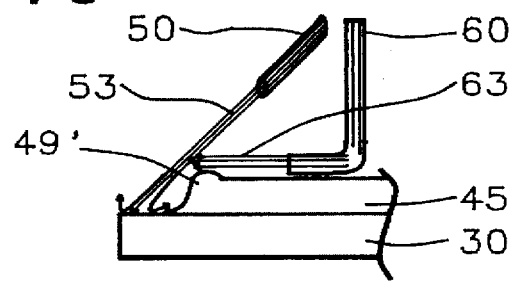
FIG. 4c is an enlarged cross section of the edge of the substrate and the condition of the spun-on-film of FIG. 4a showing the favorable action of the jet stream in leveling the formation of any hump according to the present invention.

In the preferred embodiment of the present invention, the spatial relationship of said three nozzles is arranged as shown in the schematic drawing of FIG. 4b. Dispense nozzle (40) is placed centrally at (O) with respect to turntable (20) so that said nozzle is also centrally located over substrate (30) when the latter is mounted on turntable (20). That is, the axis of dispense nozzle (40) is perpendicular to the plane of substrate (30) as shown in FIG. 4b. In said Figure, the O'p-axis of rinse nozzle (50) lies along the hypotenuse of a right triangle (70) formed with the vertical Oy-axis of dispense nozzle (40) and the base (OO'-line) projected onto the plane of substrate (30) by said O'p-axis. Thus, edge rinse nozzle (50) is directed to the edge of the substrate (30) at angle ($\alpha$) away from the vertical Oy-axis. Though the value of the angle may be varied according to the particular application, it is preferred in the case with the rinsing of spin-on-glass (SOG) that the angle ($\alpha$) be between about 37.5° and 52.5°. Jet nozzle (60), on the other hand, is placed horizontally parallel to the plane of substrate (30) and at an angle ($\beta$) formed between the base (O'O-line) of said right triangle (70) and the Ox-axis of jet nozzle (60), and behind said rinse nozzle (50) in the direction of rotation of turntable (20). In FIG. 4b, the rotation is shown to be counterclockwise, which is arbitrary. It will be appreciated that angle ($\beta$) will be varied depending upon the properties of the coating material used and the size of the hump (49) of FIG. 3c that will be formed in the absence of jet nozzle (60); in the case with SOG and conventional photoresists that will be common knowledge to those skilled in the art, it is preferred that it be between about 15° and 90°. Said nozzles (40), (50) and (60) are tubular shape and are connected to their respective reservoirs placed outside the coating chamber not shown.

In the operation of the invention apparatus, turntable (20) is rotated between about 1000 rpm to 3000 rpm, as a coating material (43) is dispensed from nozzle (40) shown in FIG. 4a. Said coating material spreads outward from the center of substrate (30) towards the edge of the same under the influence of the centrifugal forces developed by the rotation of turntable (20). It has been observed in the present state of semiconductor wafer manufacturing that when the dispensed material is spin-on-glass (SOG) or photoresist which is also spun, said materials tend to condense and adhere to the edge and side wall of the wafer. Later in the manufacturing process, such as during thermal cycling, the material so formed on the edge of the wafer disintegrates causing particle contamination problems. Therefore, edge rinse was developed to clean the edges of the coating material. In the present invention, isopropyl alcohol is preferred as the cleaning agent, and is supplied with a pressure between about 47.5 kilo Pascal (kPa) to 52.5 kPa.

However, when edge rinse alone is used, a relatively large hump (49) of FIG. 3c is formed over the edge of substrate (30) as described before in connection with the hydraulic jump phenomenon. In the present invention, a jet stream (63) issues from nozzle (60) parallel to the plane of substrate (30), and impinges upon the crest of said hump radially as shown in FIG. 4b. The stream can be any gas that is compatible with the coating material used; however, dry nitrogen or argon is preferred when spin-on-glass or photoresist is used. As depicted in FIG. 4b, stream (63) striking the hump has the effect of forming a barrier against the advancing wave of hump, and leveling the hump (49) of FIG. 3c to a relatively lower height hump (49'). It is found that said hump (49') does not crack and disintegrate during the subsequent thermal cycling of product, thereby eliminating defective parts.

What is claimed is:

1. A spin coating method comprising the steps of:
   providing a substrate on a turntable;
   dispensing a film forming material over said substrate;
   rotating said turntable;
   forming a film of coating of said film forming material over said substrate;
   rinsing said film of coating at its outer edge; and
   impinging said film at its outer edge with a jet stream of a gas that is inert to said film issuing towards the outer edge of said substrate and following said rinsing.

2. The method of claim 1, wherein said substrate is silicon wafer.

3. The method of claim 1, wherein said wafer is secured on to said turntable by means of vacuum suction.

4. The method of claim 1, wherein said film forming material is spin-on-glass (SOG).

5. The method of claim 1, wherein said film forming material is photoresist.

6. The method of claim 1, wherein said dispensing is accomplished by means of a dispense nozzle.

7. The method of claim 6, wherein said dispense nozzle is placed centrally over said substrate.

8. The method of claim 1, wherein said turntable rotates between about 1000 rpm to 3000 rpm.

9. The method of claim 1, wherein said film of coating is formed to the edge of said substrate.

10. The method of claim 1, wherein said rinsing is accomplished by means of a rinse nozzle.

11. The method of claim 10, wherein said rinse nozzle is directed at edge of said substrate.

12. The method of claim 11, wherein said rinse nozzle forms an angle of between about 37.5° to 52.5° with the vertical axis of said turntable.

13. The method of claim 10, wherein said impinging is with a jet stream nozzle placed parallel to the surface of and radially from the center of said substrate.

14. The method of claim 13, wherein said jet stream nozzle is positioned between about 15° and 90° behind said rinse nozzle measured from the center of said turntable and in the direction of rotation of said turntable.

15. The method of claim 14, wherein said jet stream is nitrogen gas.

16. The method of claim 15, wherein said jet stream is issued with a pressure between about 550 kPa to 650 kPa.

17. The method of claim 1, wherein said rinsing is accomplished with cleaning liquid isopropyl alcohol.

18. The method of claim 17, wherein said cleaning liquid is issued with a pressure between about 47.5 kPa to 52.5 kPa.

19. The method of claim 1, wherein said impinging with a jet stream is accomplished with a nozzle.

20. A spin coating apparatus comprising:
   a substrate;
   a turntable;
   a means for holding said substrate;
   a dispense nozzle above said turntable;
   an edge rinse nozzle above and at the edge of said turntable; and
   a jet stream nozzle following said edge rinse nozzle.

21. The apparatus of claim 20, wherein means for holding said substrate on said turntable is vacuum suction.

22. The apparatus of claim 20, wherein said dispense nozzle is placed centrally and above with respect to said turntable.

23. The apparatus of claim 20, wherein said edge rinse nozzle forms an angle of between about 37.5° to 52.5° with the vertical axis of said turntable.

24. The apparatus of claim 20, wherein said jet stream nozzle is placed parallel to the surface of and radially from the center of said substrate.

25. The apparatus of claim 24, wherein said jet stream nozzle is positioned between about 15° and 90° behind said rinse nozzle measured from the center of said turntable and in the direction of rotation of said turntable.

* * * * *